(12) United States Patent
Simon et al.

(10) Patent No.: US 9,174,385 B2
(45) Date of Patent: Nov. 3, 2015

(54) METHOD AND DEVICE FOR SPATIALLY PERIODIC MODIFICATION OF A SUBSTRATE SURFACE

(75) Inventors: Peter Simon, Bovenden (DE); Jan-Hendrik Klein-Wiele, Goettingen (DE)

(73) Assignee: Laser-Laboratorium Goettingen E.V. (DE)

( * ) Notice: Subject to any disclaimer, the term of this patent is extended or adjusted under 35 U.S.C. 154(b) by 476 days.

(21) Appl. No.: 13/640,958

(22) PCT Filed: Apr. 12, 2011

(86) PCT No.: PCT/EP2011/001820
§ 371 (c)(1),
(2), (4) Date: Dec. 20, 2012

(87) PCT Pub. No.: WO2011/128063
PCT Pub. Date: Oct. 20, 2011

(65) Prior Publication Data
US 2013/0140743 A1   Jun. 6, 2013

(30) Foreign Application Priority Data

Apr. 16, 2010  (DE) .......................... 10 2010 015 351
May 26, 2010  (DE) .......................... 10 2010 029 321

(51) Int. Cl.
*G02B 26/08*  (2006.01)
*B29C 59/16*  (2006.01)
(Continued)

(52) U.S. Cl.
CPC ............. *B29C 59/16* (2013.01); *B23K 26/0036* (2013.01); *B23K 26/0039* (2013.01);
(Continued)

(58) Field of Classification Search
CPC .. G02B 26/101; G02B 5/1823; G02B 5/0252; G03F 7/70408; B23K 26/0656; B23K 26/0066; B23K 26/0087; B23K 26/063; B23K 26/0648; B23K 26/0652; B23K 26/0807; B29C 59/16
USPC ............. 359/206.1, 662; 219/121.61, 121.63, 219/121.64, 121.74–121.78, 121.8; 264/446; 425/174.4
See application file for complete search history.

(56) References Cited

U.S. PATENT DOCUMENTS

| 6,882,477 B1 | 4/2005 | Schattenburg et al. |
| 2004/0074881 A1 | 4/2004 | Oishi |

(Continued)

FOREIGN PATENT DOCUMENTS

| DE | 10 2006 032 053 | 1/2008 |
| JP | 2005-66628 | 3/2005 |

OTHER PUBLICATIONS

International Search Report of Aug. 24, 2011.
(Continued)

*Primary Examiner* — James Phan
(74) *Attorney, Agent, or Firm* — Gerald E. Hespos; Michael J. Porco; Matthew T. Hespos (57) ABSTRACT

The invention relates to a method and a device for modifying in a spatially periodic manner at least in some regions a surface of a substrate (24), said surface being disposed on a sample plane (P) for which end different regions (211, 221, 231, 232) of the substrate surface are acted upon successively with a spatially periodic illumination pattern of an energy density above a processing threshold of the substrate surface, where the illumination pattern is generated by diffraction of an input beam (10) and superimposition of resulting, diffracted sub-beams (12, 14) by means of a grid interferometer (100), and where, in order to select the substrate surface region to be illuminated in each case (211, 221, 231, 232), the input beam (10) is deviated by means of a beam-deviating unit (16) arranged upstream of the grid interferometer (100).

15 Claims, 5 Drawing Sheets

(51) Int. Cl.
  *B23K 26/00* (2014.01)
  *B23K 26/06* (2014.01)
  *B23K 26/08* (2014.01)
  *G03F 7/20* (2006.01)

(52) U.S. Cl.
  CPC ......... *B23K26/0066* (2013.01); *B23K 26/0087* (2013.01); *B23K 26/063* (2013.01); *B23K 26/0648* (2013.01); *B23K 26/0652* (2013.01); *B23K 26/0656* (2013.01); *B23K 26/0807* (2013.01); *G03F 7/70408* (2013.01)

(56) References Cited

U.S. PATENT DOCUMENTS

2006/0109532 A1  5/2006  Savas et al.
2007/0138151 A1  6/2007  Tanaka et al.

OTHER PUBLICATIONS

International Preliminary Report on Patentability, Oct. 16, 2012.

METHOD AND DEVICE FOR SPATIALLY PERIODIC MODIFICATION OF A SUBSTRATE SURFACE

BACKGROUND OF THE INVENTION

1. Field of the Invention

The invention relates to a method for modifying in a spatially periodic manner at least in some regions a surface of a substrate, said surface being disposed on a sample plane, for which end different regions of the substrate surface are acted upon successively with a spatially periodic illumination pattern of an energy density above a processing threshold of the substrate surface, wherein the illumination pattern is generated by diffraction of an input beam and superimposition of resulting, diffracted sub-beams by means of a grid interferometer, and wherein, in order to select the substrate surface region to be illuminated in each case, the input beam is deviated by means of a beam-deviating unit arranged upstream of the grid interferometer. The invention relates further to a device for modifying in a spatially periodic manner at least in some regions a surface of a substrate, said surface being disposed on a sample plane, comprising a beam-deviating unit to select a current processing region by controlled deviation of an input beam, and a grid interferometer arranged downstream from the beam-deviating unit, which interferometer bends the input beam and superimposes in the sample plane the resulting, diffracted sub-beams to create a spatially periodic illumination pattern in the current processing region.

2. Description of the Related Art

Methods and devices in the field of the invention are known from DE 10 2006 032 053 A1. Such devices and methods are used in areas such as security technology to equip documents, coins, bank notes, etc. with an anti-counterfeit security feature. When the correct pattern is selected, the structures implanted in the surfaces of films, coins, plastic carriers and other substrates produce defined optical effects, e.g. a reflection that is dependent on wavelength and/or direction.

Figure 1:
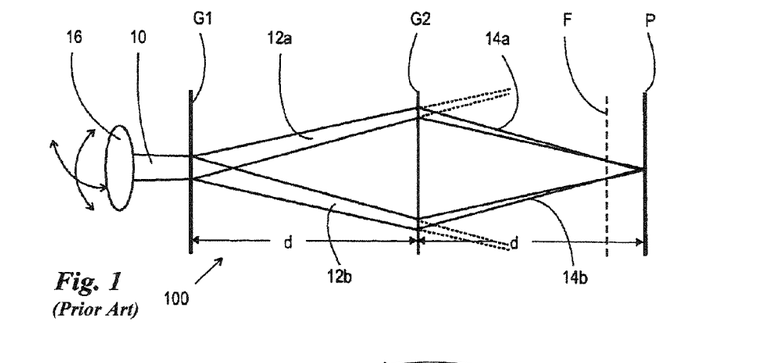
FIG. 1 is a schematic representation of a prior art device.

For the generic method and/or generic device, an input beam, especially a laser beam, is directed through a grid interferometer to create the spatially periodic illumination pattern. For the purposes of this application, a grid interferometer is understood to be a device with at least two optical grids parallel to one another and which are essentially horizontally arranged with respect to an optical axis where an input grid is arranged so as to split an input beam into a plurality of sub-beams by diffraction, and an output grid is arranged so as to reconstitute in a sample plane a selection of the sub-beams created at the input grid or at other intermediate grids. The distance d between two adjacent grids is typically equal to the distance between the grid that is last following the direction of the beam and a sample plane P arranged further downstream with respect to the beam. The periods of the grids are in a specific proportion to one another that determines the orders of the usable sub-beams that interfere with one another and are superimposed in P. The following applies generally to the embodiment of the grid interferometer that is particularly relevant in practice, namely a two-grid interferometer with two grids G1 and G2 with corresponding grid periods p1 and p2: If the sub-beams of order n1 created by way of diffraction at G1 are again diffracted at G2 and the resulting sub-beams of order n2 are made to interfere and superimpose in P, the proportion of the grid periods should be $p2/p1=n2/(2*n1)$. An expert would be familiar with the generalisation extending to grid interferometers with more than two grids. FIG. 1 illustrates the beam path of such a two-grid interferometer with $n1=1$ and $n2=2$, i.e. $p1=p2$. Suitable means of beam selection, e.g. apertures, are provided to select the correct sub-beams; for purposes of clarity they are not represented in FIG. 1.

A major advantage of the grid interferometer is its quality of forming the interference pattern independently of spatial and temporal coherence, wavelength, and incident angle of the input beam. In practice, it will be difficult to completely, i.e. perfectly, satisfy the above conditions regarding distances and grid periods; however, even under realistic conditions in practice, the aforementioned independence of the input beam's parameters remains true, at least to the relevant extent.

If the energy density of the illumination pattern is high enough to overcome a process threshold of the substrate surface, a corresponding permanent structure can be thus implemented within the substrate surface. The concept of process threshold is conceived broadly and encompasses, for example, a destruction threshold (e.g. for laser ablation) as well as energy thresholds for thermal or photochemical reactions.

Such process thresholds are generally relatively high, which means that strong focussing on the substrate surface is usually necessary. The cited category-defining document is therefore especially concerned with forming the input beam such that the energy density on the substrate surface is high enough to overcome the process threshold, yet also that the energy density in the region of the grid interferometer remains sufficiently low to as not to provoke destruction of the grid. The strong focussing ultimately means that the given region of the substrate surface that is illuminated, i.e. the current processing region, is comparatively small.

To create large-scale patterns, the cited document therefore suggests that a beam-deviating unit, such as a mirror scanner that deviates the input beam such that the illumination pattern can be shifted in a larger region of the substrate surface such that a large-scale structure can be successively created the substrate surface.

However, this approach is limited as the size of the region that can be achieved is highly restricted. The position of the focal plane of the input beam, especially its distance from the sample plane, varies with the deviation angle. The focus is on a spherical shell segment around the point of deviation. The image sharpness of the interference pattern, as well as the energy density with which the sample surface is hit, vary accordingly, and thus the processing efficiency varies depending on the diffraction angle.

A method and a device as described above are known from US 2006/0109532 A1, however without a beam-deviating unit. To process larger substrates, the substrates are positioned on a movable platform that is shifted after a sub-field has been processed such that a second field for processing is shifted into position at the place where the interference pattern is created.

U.S. Pat. No. 6,882,477 B1 also discloses a similar device without a beam-deviating unit and with a movable sample platform.

A method and device for laser tempering of polycrystalline semi-conductor layers are known from US 2004/0074881 A1. It relates to using a focussed laser beam to scan a processing surface. To do so, a collimated beam is deviated by a galvanometric mirror scanner wherein an F-Theta lens arranged downstream from the mirror scanner serves to focus the beam on the substrate surface independently of the deviation angle.

It is the task of the present invention to improve a generic method and a generic device such that it is possible to create large-scale patterns.

SUMMARY OF THE INVENTION

The invention relates to a method for modifying in a spatially periodic manner at least in some regions a surface of a substrate, said surface being disposed on a sample plane, for which end different regions of the substrate surface are acted upon successively with a spatially periodic illumination pattern of an energy density above a processing threshold of the substrate surface, wherein the illumination pattern is generated by diffraction of an input beam and superimposition of resulting, diffracted sub-beams by means of a grid interferometer, and wherein, in order to select the substrate surface region to be illuminated in each case, the input beam is deviated by means of a beam-deviating unit arranged upstream of the grid interferometer. The method further includes passing the input beam through an F-Theta lens between the beam-deviating unit and the grid interferometer.

The invention relates further to a device for modifying in a spatially periodic manner at least in some regions a surface of a substrate, said surface being disposed on a sample plane, comprising a beam-deviating unit to select a current processing region by controlled deviation of an input beam, and a grid interferometer arranged downstream from the beam-deviating unit, which interferometer bends the input beam and superimposes in the sample plane the resulting, diffracted sub-beams to create a spatially periodic illumination pattern in the current processing region. The device further has an F-Theta lens arranged between the beam-deviating unit and the grid interferometer.

Lenses that consistently focus a collimated beam on the same plane independent of its incident angle are known as F-Theta lenses. Therefore it can be ensured with such a lens that the process threshold of the sample surface is exceeded to the same degree in each sub-region of the whole pattern, i.e. the sample surface can be processed equally efficiently over its whole region.

The preferred form of the F-Theta lens is the telecentric F-Theta lens. In a traditional F-Theta lens, the input beam hits the grid interferometer at an angle except when creating the central region of a large-scale structure. As mentioned above, it is a particular feature of the grid interferometer that the pattern is created independently of the incident angle of the input beam. However, as the incident angle increases, the tolerance for errors in positioning the sample, the relation among the grid properties, and the orientation of the individual grids of the interferometer decreases strongly. The size of the structure that can be created is therefore limited in practice by the unavoidable imperfection of the grid interferometer. Telecentric F-Theta lenses have the effect of taking a beam arriving at an angle and outputting it as an output beam that is shifted as a function of the incident angle and is parallel to the optical axis, thereby allowing the beam waist of a converging beam to remain in the same plane independently of the shift and/or incident angle. With regard to the present invention, this always results in the input beam hitting the grid interferometer vertically such that the formation of the interference pattern has maximum error tolerance.

Ideally, the F-Theta lens is designed such that it allows the input beam to converge such that its deviated sub-beams exhibit a beam waist in the vicinity of the sample plane. The idea of a beam waist positioned in the vicinity of the sample plane, which also includes positioning the beam waist in the sample plane, is in principle familiar and is the subject of the aforementioned DE 10 2006 032 053 A1. This measure ensures that the process threshold of the substrate is exceeded by sufficient focussing of the illumination pattern and, at the same time, that the grid structure of the grid interferometer is not damaged by excessive energy density. In the known device, however, the beam is formed by special means of beam formation arranged upstream from the beam-deviating unit. With regard to the present invention, this function can be taken on by the F-Theta lens, which therefore has a double function.

To sharply delineate the processing region, an aperture can be placed in the beam path of the input beam, upstream from the beam-deviating unit, such that said aperture can be illustrated in the sample plane. It is especially preferred to select a form of aperture that fills the region, such as a square or hexagon, such that the complex overall structure can be built up in a brick or honeycomb form from individual regions in a mosaic-like way so as to fill the region without any overlap or gaps between the various regions.

Alternatively, the input beam, especially before it enters the beam-deviating unit, can pass through what is known as a flat-top converter, which transforms any Gauss profile of the input beam into a relatively sharply defined, largely homogenous beam profile.

The invention makes it possible to design a given pattern at a larger scale, as explained above. In other words, the structure created in a processing region can be extended in the same form over a plurality of adjacent processing regions. More complex patterns, especially those required for complex security features on documents, bank notes, coins, etc., cannot be created in this manner, however. The following preferred improvements discussed below represent different approaches to solve this problem.

In a first approach to improve the method pursuant to the invention, the grid interferometer is moved perpendicularly relative to its optical axis by way of a drive in a manner that is synchronous with the deviation of the input beam. With regard to the device pursuant to the invention, this means that it is characterised by a drive by means of which the grid interferometer can be moved perpendicularly relative to its optical axis, and a synchronisation unit by means of which the deviation of the input beam and movement of the grid interferometer can be controlled synchronously.

The basic idea behind this improvement, which in principle can be realised as an independent invention, i.e. without an F-Theta lens arranged upstream from the grid interferometer, is that of designing the grid interferometer such that it is movable and equipping it with a drive synchronised with the deviation of the input beam. In this manner, every deviation position, i.e. each current processing region on the substrate surface, can be assigned a defined orientation and/or position of the grid interferometer. If, as explained in more detail below with regard to preferred embodiments, the created pattern is dependent on the orientation and/or positioning of the grid interferometer, which orientation and/or position can be changed by way of the drive, different processing regions on the substrate surface can be assigned different illumination patterns such that a defined mosaic can be created from different partial structures and form an overall structure.

In an advantageous embodiment of the method pursuant to the invention, the input beam is a pulsed beam whose pulse sequence is synchronised with the deviation of the input beam and the movement of the grid interferometer. With regard to the device pursuant to the invention, this means that the input beam is a pulsed beam whose pulse sequence can be synchronised by means of the synchronisation unit with the deviation of the input beam and the movement of the grid interferometer. The term synchronisation is used broadly here and includes all forms of intentionally controlled temporal dependencies. In particular, the term does not imply any hierarchy within the temporal sequences which are independent of one another. However, the pulse sequence of the input beam typically has a special significance; in particular, the control of the beam-deviating unit is hierarchically subservient to it. This applies in particular when the clock of the pulsed laser is used as the master clock of synchronisation. However, it is also possible to actively and intentionally structure the pulse sequence of the input beam using mechanical and/or optical, especially electro-optical, shutters.

Ideally the movement of the grid interferometer includes a rotation around its optical axis or an axis parallel to it. With regard to the device pursuant to the invention, this means that the drive preferably comprises a rotation unit by means of which the grid interferometer can be rotated around its optical axis or an axis parallel to it. Alternatively or in addition, the movement of the grid interferometer can comprise a perpendicular translation about its optical axis. With regard to the device pursuant to the invention, this means that the drive comprises a translation unit by means of which the grid interferometer can be shifted perpendicularly about its optical axis.

In particular, in connection with the aforementioned capacity for rotation of the grid interferometer, it is preferable that the grid interferometer have a non-rotationally symmetrical grid structure. Purely as an example of a non-rotationally symmetrical grid, a grid interferometer with line grids with periodicity determined in relation to each other is mentioned. Such a grid interferometer creates a line pattern as an illumination pattern on a substrate surface. Rotating the grid interferometer around its optical axis or an axis parallel to it causes the lines of the illumination pattern to rotate accordingly. By rotating the grid interferometer by a rotation angle that is not a integral number multiple of 180 degrees, illumination patterns can be created that differ in the orientation of their lines. By synchronising the rotation of the grid interferometer, the diffraction of the input beam and, if applicable, the pulse sequence of the input beam, a complex structure can be created on the substrate surface composed of regions in which the lines are oriented differently. The application of this special example to any other type of non-rotationally symmetric grid structures, such as cross grids, is a straightforward matter for an expert.

In another embodiment of the present invention, the grid interferometer has a plurality of adjacent regions with different grid structures. For instance, the regions with different grid structures are arranged in the form of circular sectors, which together can form a full circle. This version is recommended in particular in connection with the capability of the grid interferometer to rotate. For example, the different sectors can exhibit grid structures in the form of line and/or cross grids with differing periodicity. Thus, by suitably rotating the grid interferometer, the desired pattern form and/or pattern periodicity can be set for a selected region of the substrate surface. In addition, a minor rotation not going beyond the border of the sector can be used to set the angular orientation of the illumination pattern. Of course, the adjacent regions of the grid interferometer with different grid structures can be arranged in a different way relative to one another. For example, a linear row of two or more regions with different grid structures can be realised. This version is available in particular in connection with a translation movement of the grid interferometer.

To achieve the most rapid possible process times, i.e. the shortest times required to create the desired complex structures on the substrate surface, it is necessary to optimise for each individual case the controlling of the mutually cooperating components of the invention. The practical limitations of the individual components should be taken into account. For example, the pulse clock of the input beam is generally determined to a very great extent by the design of the specific laser being used, where ultimately individual pulses can be left out by means of a pulse picker. The beam-deviating unit, which can be constituted as a mirror scanner, in particular a micro-mirror scanner, is generally that part of the device that can be most quickly controlled. Micro-mirror scanners, which can be controlled in the kilohertz range and faster, are known to the expert. In contrast, the drive of the grid interferometer can only be moved rather slowly, simply by virtue of the inertia of the grid interferometer. In embodiments with a rotatable grid interferometer, it is possible to control it such that the grid interferometer rotates at a constant rate and more slowly, compared to the illumination time required to form the structure. The synchronisation unit is aware of the given angle setting. For example, it can be continuously measured by sensors. The synchronisation unit determines the resulting illumination pattern and controls the beam-deviating unit such that a region of a substrate surface is illuminated which has been assigned a partial structure with the currently set pattern within the complex overall structure. It is preferable that this take place according to the master clock of the input beam pulse. However, this manner of controlling will generally be limited to those applications in which a single pulse is sufficient to form the structure in the substrate surface.

It will often be necessary to use multiple illumination pulses to structure a process region of the substrate surface. The position of the grid interferometer relative to the sample must not change between the individual pulses. Even minor variations, such as can be caused by vibrations in the system, can alter the resulting illumination pattern such that the intended structure is destroyed or is at least distorted. Therefore in a further development of the invention, the sample plane is constituted by way of a sample carrier rigidly bound to the first slide pad and the grid interferometer is rigidly bound to a second slide pad where a slide surface of the second slide pad is arranged on top of a corresponding slide surface of the first slide pad such that the second glide pad can be moved by the drive toward the first slide pad and where the second slide pad is capable of enduring a contact force sufficient to prevent relative motion between the slide pads. By embedding the grid interferometer in the second slide pad, it is ensured that the individual grids of the grid interferometer remain fixed in orientation and position relative to one another. Otherwise, it can be ensured that the sample does not vibrate by rigidly binding it to the first slide pad. It is preferable that the first slide pad sit on a solid base, e.g. a heavy machine foundation. The movement of the second slide pad with the grid interferometer is not critical to the extent that this second slide pad is pressed firmly against the corresponding slide surface of the first slide pad and is force-locked to it at the time of surface processing, i.e. at the time of the illumination pulse. Only at times at which no surface processing, i.e. illumination, is taking place, a relative motion is enabled by releasing the contact force which motion can absorb both the intended rotation and/or translation of the grid interferometer and also any undesired vibrations. Choosing a friction bearing without intermediate fixation elements, such as is the case for a roller bearing, has the advantage of making it possible to reproduce the relative positioning of the two slide pads with high precision for every new force contact.

The pressing force can be produced in various ways. For example, the slide pads can be equipped with corresponding elements of an electromagnetic contact force device. For example, corresponding spindles, or one spindle and one ferromagnetic core capable of being easily electrically controlled, can be embedded in the slide pads. Alternatively, the second slide pad can be coupled with an actuator of an electric motor-based, hydraulic, or pneumatic pressing force device.

It would be straightforward for an expert to design the slide surfaces, for example, as polished glass or stone surfaces that may include a fluid or gaseous slide film between them.

As has been mentioned several times, the precise orientation of the individual grids within the grid interferometer is absolutely critical. Therefore in the scope of the present invention, all individual grids comprised by the grid interferometer must be moved in complete synchrony. When the grids are fixed in place individually, this is not possible to achieve in practice. Therefore, in an especially advantageous improvement of the device pursuant to the invention, the grid interferometer comprises two transmission grids arranged parallel to one another, each of which is rigidly bonded on its face to a hollow distancing element. For example, a hollow cylinder or a die-shaped or rectangular rigid frame can be used, to whose face sides the transmission grids are attached and adjusted. When correctly positioned, the grids can then be bonded to the frame using a non-shrinking putty or cement. The resulting, single-piece grid interferometer is very strong and can be used as a whole in a motor-moved holder that is part of the device pursuant to the invention. It is also easy to exchange it. This is advantageous with regard to the industrial use of the invention in which a plurality of structure patterns must be produced with a single production system. The device components of laser, beam-deviating unit, drive, sample carrier, and synchronisation unit can be retained regardless of the pattern. Only the programming of the synchronisation unit, typically realised through software, and the easily exchangeable grid interferometer as described above, if applicable, must be changed in order to produce a new structure pattern.

In a second approach to improving the method pursuant to the invention, the grid interferometer comprises
- a first, input-side grid, which exhibits grid periodicities in at least two directions, and
- a second, output-side grid that exhibits a plurality of pairs of sub-grids, each pair having a grid periodicity that is identical within each pair and is parallel to respectively one grid periodicity of the first grid, where the sub-grids of each pair are arranged and spaced diametrically and their respective grid periodicity is oriented parallel to their distance line where a variable aperture arrangement to select diffracted sub-beams to be superimposed in the sample plane is varied synchronously with the deviation of the input beam.

With regard to the device pursuant to the invention, this means that the grid interferometer comprises
- a first, input-side grid, which exhibits grid periodicities in at least two directions, and
- a second, output-side grid that exhibits a plurality of pairs of sub-grids, each pair having a periodicity that is identical within each pair and is parallel to respectively one grid periodicity of the first grid where the sub-grids of each pair are arranged and spaced diametrically and their respective grid periodicity is oriented parallel to their distance line, where a variable aperture arrangement to select diffracted sub-beams to be superimposed in the sample plane is arranged downstream from the first grid of the grid interferometer.

The basic idea behind this improvement, which in principle can be realised as an independent invention, i.e. without an F-Theta lens arranged upstream from the grid interferometer, is to fix in place the grid interferometer itself, while designing it such that in each case a plurality of diffracted sub-beams are produced that can in principle be superimposed so as to interfere in the sample plane, of which sub-beams however only the pair that is capable of creating the desired structure within the current processing region is selected. The input beam hitting the first, input-side grid is split by this into diffraction fans that are oriented differently. In particular, each grid periodicity generates its own diffraction fans consisting of diffracted sub-beams with differing orders of diffraction. An especially simple embodiment of a grid with multiple grid periodicities oriented differently is a cross grid consisting of two line grids arranged perpendicularly to one another. Such a grid exhibits three grid periodicities, namely the periodicity of the first line grid, the periodicity of the second line grid, which is rotated 90° compared to the first, and two additional grid periodicities that are rotated by 90° with respect to one another and by 45° with respect to the two aforementioned grid periodicities. Such a cross grid generates four diffraction fans of which only the first orders of diffraction are taken into account in the following for reasons of clarity, for which reason only sub-beam pairs are discussed below. An expert would be aware of how to construct grids in which all orders other than a desired order are effectively suppressed. If at the second grid of the grid interferometer, the split sub-beam pairs fall on line grids coordinated in the aforementioned manner to match the grid periodicities of the first grid of the grid interferometer, the resulting output beams of the grid interferometer will superimpose and interfere in the current processing region. In order to now precisely select the sub-beam pair that will generate the desired interference pattern, a variable aperture arrangement is provided. It must absolutely be arranged behind the first grid of the grid interferometer, which includes arranging it before or behind the second grid of the grid interferometer. The latter version is preferred due to its simpler construction. As already mentioned, the principle is explained with regard to the "sub-beam pairs" merely to aid understanding. An expert would recognise that it is possible to superimpose more than only two sub-beams in order to generate the interference pattern. The desired number of sub-beams to be superimposed can be achieved by modifying the aperture arrangement accordingly. The following explanations should be interpreted in this sense.

There are various special ways to design the aperture arrangement. For example, the variable aperture arrangement can be designed as a rotatable disc with windows in some regions. Depending on the disc's angle of rotation, undesired beam pairs are blocked out. Only the desired beam pairs pass through the window to superimpose in the sample plane.

Alternatively, the variable aperture arrangement can be designed as a controllable electro-optical or magneto-optical transmission filter whose degree of transmission varies and/or can be varied by surface region by way of appropriate electrical controlling. For example, a freely programmable liquid crystal screen can be used for this.

The input beam is preferably a pulsed beam whose pulse sequence is synchronised, especially by way of the synchronization unit, with the deviation of the input beam and the variation of the aperture arrangement.

Such a grid interferometer, i.e. a grid interferometer comprising a first, input-side grid which exhibits grid periodicities in at least two directions and is essentially perpendicular to an optical axis, and a second, output-side grid arranged parallel to the first grid, where the second grid has a plurality of pairs of sub-grids with a periodicity that is identical within each pair and is parallel to respectively one grid periodicity of the first grid, where the sub-grids of each pair are arranged at a distance from the optical axis in mirror symmetry and perpendicularly to its distance line, can be used on its own in other technical contexts with and without the various forms of variable aperture arrangement.

In a third approach to improve the method pursuant to the invention, the grid interferometer has at least one freely programmable grid whose grid structure is controlled in a manner that is synchronised with the deviation of the input beam. With regard to the device pursuant to the invention, this means that the grid interferometer has at least one freely programmable grid whose grid structure can be varied using a grid structuring control unit, and furthermore, that a synchronization unit is provided that can be used to control in a synchronised way the deviation of the input beam and the variation of the grid structure of the grid, of which there is at least one.

The basic idea behind this improvement, which in principle can be realised as an independent invention, i.e. without an F-Theta lens arranged upstream from the grid interferometer, is to design the grid interferometer such that it can be changed in and of itself, making it possible to dispense with any capacity for mechanical motion. This also counters any vibrations in the system that could disturb, and especially distort, the illumination pattern and/or the structure that is to be created in the substrate surface.

It is in principle sufficient to design only one grid of the grid interferometer such that it is variable in this way. However, it is more favourable to design all grids of the grid interferometer variably such that the variety of patterns that can be realised is as large as possible.

It is advantageous for the freely programmable grid to be designed as an essentially transparent, flat element whose transparency and/or refractive index is varied pixelwise through electrical controlling and/or can be varied pixelwise with regard to the corresponding device. An expert would be familiar with such elements in the form of liquid crystal elements that can be controlled pixelwise, which are preferable for use with regard to the invention. Such elements are typically implemented as windows in a frame containing the control electronics, which frame also has electrical connections. The windows, which are transparent in themselves, contain a liquid crystal layer by way of which the individual pixels of the window can be modified in respect of their transparency characteristics and/or their refractive index in response to appropriate electrical controlling. Virtually any form of phase or amplitude grid can be realised in this way.

Alternatively to such transmissive grids, the grid interferometer can also be realised using freely programmable reflective grids. In particular, in an embodiment of the invention the freely programmable grid can be designed as an essentially reflective, flat element whose reflectivity can be varied pixelwise using electrical controls. An expert would be familiar with such reflective, flat elements, such as tilt mirror arrays that can be controlled pixelwise.

Regardless of the specific design of the freely programmable grid, the controlling, and thus the variation of the grid, can take effect very quickly such that it is excellently suited to synchronise with the beam-deviating unit. Moreover, in an improvement of the invention, the input beam is a pulsed beam whose pulse sequence is synchronised, especially by means of the synchronization unit, with the deviation of the input beam and the variation of the grid structure.

Further features and advantages of the present invention are apparent from the following, specific description as well as from the drawings.

DETAILED DESCRIPTION OF THE PREFERRED EMBODIMENTS

FIG. 1 is a schematic representation of a two-grid arrangement in accordance with the prior art, which is suitable to directly perform a surface modification dependent on the process threshold in order to structure a substrate surface. To ensure the clarity of the drawing, sub-beams of unused orders are not shown or are only shown as dashed lines, as are apertures used to block them and similar aids.

An input beam 10 falls on a two-grid interferometer 100 formed from grids G1 and G2. The individual grids G1 and G2 are designed as line grids with a grid orientation that is perpendicular to the drawing plane where the period of the first grid G1 is twice as great as the period of the second grid G2. They are oriented parallel to one another at a distance d. The input beam 10 is split into multiple orders of diffraction at the first grid G1, of which the first orders 12a and 12b are illustrated in FIG. 1. Sub-beams of lower and higher orders are not shown in FIG. 1. At the second grid G2, the sub-beams 12a, 12b undergo another diffraction where especially sub-beams 14a and 14b of the [sic] once again first orders are superimposed to form an interference pattern in the sample plane P. An expert would be familiar with this basic manner in which a grid interferometer works. An expert would also be familiar with generalizations for multi-grid interferometers and/or other grid structures and/or differing periodicities of the individual grids. It is intended that all such versions also be comprised by the present invention.

In the prior art embodiment illustrated in FIG. 1, the input beam 10 can be deviated by a scanner 16 such that by successive illumination of adjacent regions of the substrate surface in the sample plane P, a large-format, consistent structure can be created.

In the prior art embodiment shown in FIG. 1, the input beam is a converging beam that is formed by beam-forming means (not shown) such that the sub-beams 14a, b superimposed in the sample plane P to form the illumination pattern exhibit a beam waist at adjacent focal plane F. In other embodiments, the focal plane F can also be located behind or in the sample plane P. The feature of focal plane F that is adjacent to sample plane P is also the subject matter of a preferred embodiment of the present invention, where it could however in principle also work with a non-converging input beam 10, in particular, with a collimated input beam 10.

Figure 2:
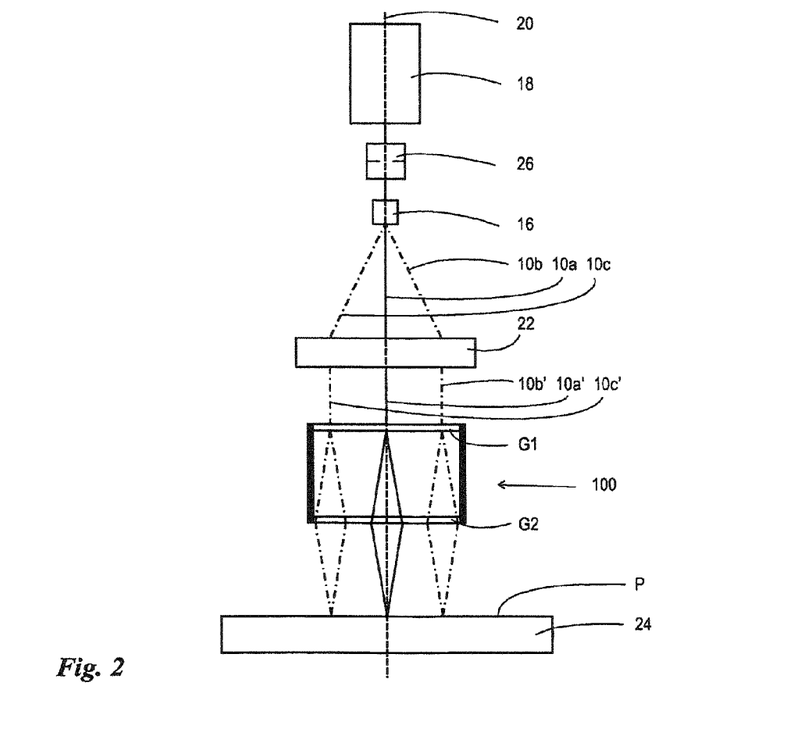
FIG. 2 is a schematic representation of an improvement pursuant to the invention with the device in FIG. 1.

FIG. 2 is a schematic representation of a device pursuant to the invention designed to directly perform a surface modification dependent on a process threshold in order to structure a substrate surface. An input beam 10 generated by a light source 18, which is preferably realised as a laser and in particular, a pulsed laser, passes through a scanner 16 that can be designed as a controllable mirror scanner, for example, but can be realised in another form.

In FIG. 2, in addition to the central beam 10a that is represented as a solid line following the optical axis 20, which is represented as a dashed line, two beam paths 10b, 10c are shown as dashed lines which the input beam 10 follows if the scanner 16 is in a deviated position.

The input beam then passes through a telecentric F-Theta lens 22 that outputs perpendicular output beams 10a', 10b', 10c' independently of the angle of incidence which beams follow a path parallel to the optical axis and whose distance from the optical axis preferably depends linearly on the angle of deviation of the scanner 16. The beams 10a', 10b', 10c' form the input beams falling perpendicularly on the grid interferometer 100 which beams are diffracted in the known manner and recombined to form the illumination pattern in the sample plane P on the surface of the substrate 24.

For purposes of clarity of FIG. 2, the beam formation, in particular, the convergence and beam waists are not shown. However, it is preferable for the F-Theta lens to be designed such that the beams exhibit a beam width in the vicinity of or within the sample plane P.

In FIG. 2, an aperture arrangement 26 is drawn purely schematically in the beam path, which beam path serves to sharply delineate the current processing region, i.e. the region of sample plane P that is illuminated by the illumination pattern at any given time. The aperture arrangement 26 is to be integrated into the beam path such that the aperture defining the delineation of the processing region is shown in the sample plane P. As an alternative to aperture arrangement 26, other means of beam formation, such as a flat-top converter, can be used to sharply delineate the processing region. Of course, it is of course in principle also possible to dispense entirely with such means of beam formation.

Figure 3:
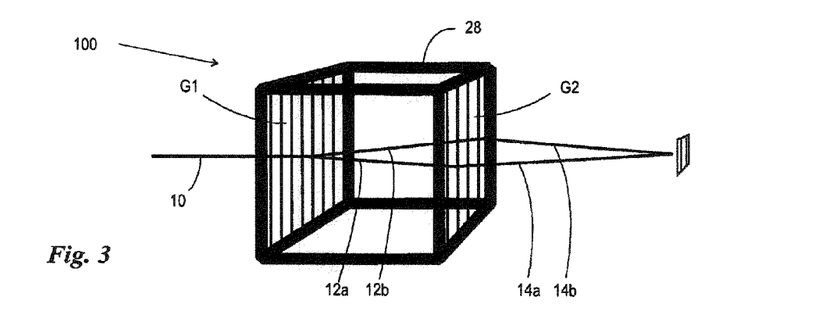
FIG. 3 is a schematic representation of an embodiment of a two-grid interferometer.
Figure 4:
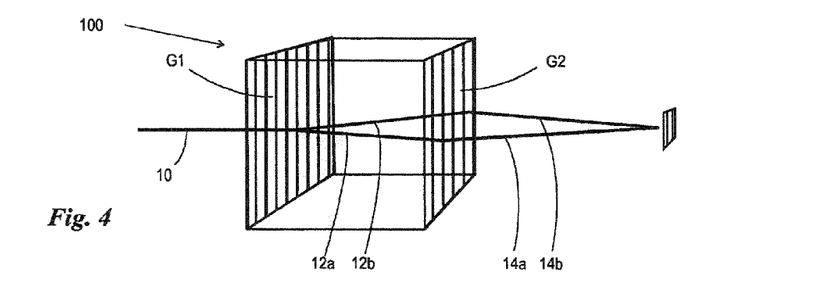
FIG. 4 is a schematic representation of an alternative embodiment of a two-grid interferometer.

To create a sharp interference pattern in the sample plane, the quality of the grid interferometer 100 is of prime importance. In particular, the grids that form the grid interferometer 100 must be adjusted very precisely to one another and must never move relative to one another during processing. A single hanging and single adjustment of the grids is therefore not optimal. FIGS. 3 and 4 show different embodiments of a two-grid interferometer 100 that solve this problem. In the first embodiment shown in FIG. 3, a rigid frame 28 is provided, which in the shown embodiment follows the edges of a cube. For instance, the frame can be formed from solid metal struts bonded to one another. The grids G1 and G2 are placed on opposite faces of the cube and are rigidly fixed to the frame 28 along their edges. To produce such a grid interferometer, the grids G1 and G2 are preferably first adjusted with respect to one another at the frame 28 and then fixed to the frame 28 using a non-shrinking putty. In so doing, after adjustment, it is possible to putty-in adjustment aid devices, which support adjustment screws supported on the frame 28, for example. After the putty dries, such a grid interferometer is very sturdy and can easily be moved quickly and/or exchanged without readjustment being necessary.

The embodiment of the two-grid interferometer 100 shown in FIG. 4 is based on a transparent monolithic block 30. At least two opposite faces of the monolithic block 30 must be produced parallel to one another with the greatest precision, and polished. Grid structures can then be installed into these precision faces, for example by mechanically scratching, laser ablation, or wet-chemical corrosion, or in another manner. In this embodiment, later adjustment is not possible; rather, the entire production process must be carried out with the utmost precision. The resulting grid interferometer 100, however, is as sturdy and easy to move and/or exchange as the grid interferometer in accordance with FIG. 3.

A device pursuant to the invention, as heretofore described, is capable, as is described in detail in the general description, of structuring large processing regions by structuring small processing regions successively. In addition to the sheer size of the processing region, increasing the complexity of the pattern that can be created is a relevant objective, especially for security technology.

Figure 5:
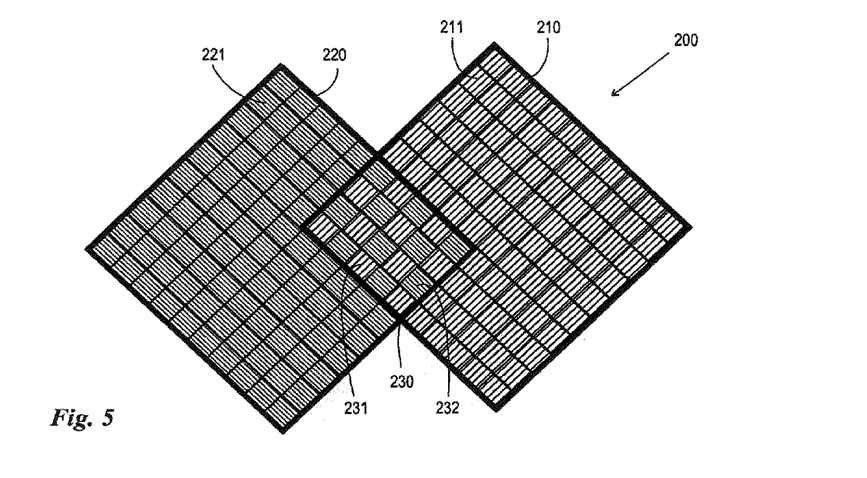
FIG. 5 is a schematic representation of a complex surface structure.

FIG. 5 shows a highly schematised representation of a pattern 200 composed of two square partial patterns 210, 220 that overlap one another in an overlap region 230. The squares 210, 220 are composed of individual processing regions 211, 221, which exhibit a line structure generated in the manner described above. The line orientation of processing regions 211, 221 is different. It should be noted that in FIG. 5 the border lines between the processing regions 211 and 221 of squares 210 and 220, respectively, serve only to emphasise the processing regions and their mosaic-like composition. The structure actually created will generally not exhibit any such border lines; rather, the squares 210, 220 should each appear thoroughly shaded.

If the line distances are chosen appropriately, different optical effects result independent of the shading, especially various reflective properties, so that from various angles of view, only one of the squares 210, 220 is visible. In the overlap region 230 of the squares 210, 220, the pattern orientation alternates between processing regions 231, 232. Typical measurements for such a pattern are line distances from 1 to 1.5 micrometres and "pixel sizes", i.e. lateral extensions of the individual processing regions 211, 221 and 231, 232, respectively, of approx. 50 micrometres or, preferably, less. This choice of "pixel size" is owing to the resolution of the human eye. In particular, those patterns are preferred whose "pixels" cannot be resolved by the human eye. In this way, overlap regions no longer appear as a "grid" as in overlap region 230; rather, the visible partial pattern 210, 220 appears to be continuous from every angle of view. If other optical effects are desired, different size parameters can also be chosen other than those specified.

Two create a pattern, such as that in FIG. 5, it is necessary to actuate a particular desired illumination pattern. This can be done in various ways; three especially advantageous ways are described below along with the associated devices.

Figure 6:
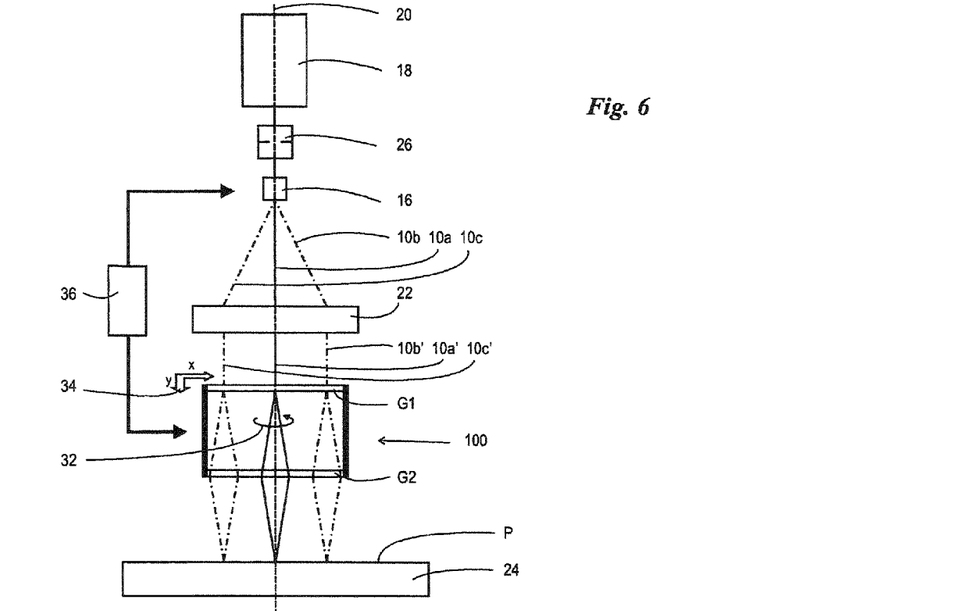
FIG. 6 is a schematic representation of a device pursuant to the invention to create a structure in accordance with FIG. 5.
Figures 7, 8:
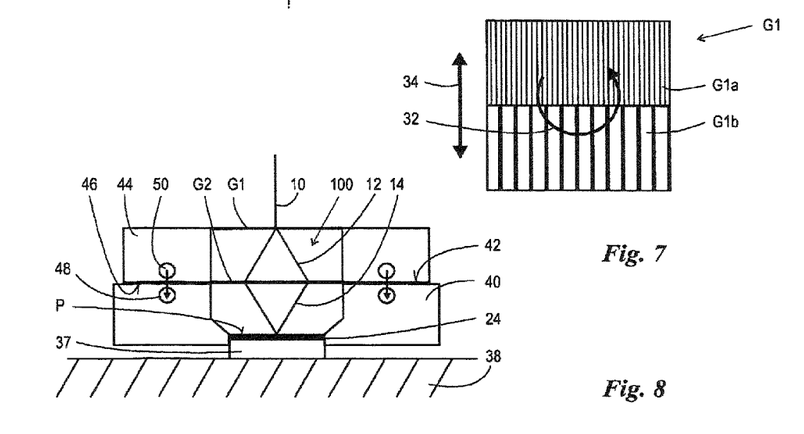
FIG. 7 is a schematic representation of an embodiment of an advantageous grid structure.
FIG. 8 is a schematic representation of a mechanical realization of the device in FIG. 6.

FIGS. 6 to 8 relate to an initial embodiment of the device pursuant to the invention where the grid interferometer 100 is moved by a motor in a manner synchronous with the scanner 16. In FIG. 6, which otherwise corresponds to FIG. 2, this is suggested by a rotation arrow 32 and a translation arrow 34, which indicate the moveability of the grid interferometer 100, and by the synchronization unit 36, which synchronises the drive of the grid interferometer 100 and the actuation of the scanner 16.

The synchronization unit is typically computer-based. The special relationship between deviation angle, i.e. selection of a processing region, and pattern selection, i.e. orientation and/or positioning of the grid interferometer 100, is typically stored in software.

FIG. 7 shows a simple embodiment of a two-region grid for use in a grid interferometer 100 in accordance with FIG. 6.

For example, the grid shown in FIG. 7 is referred to as the first grid G1. This grid G1 comprises two sub-regions G1a and G1b, which are laid out as parallel line grids with differing periodicity. An expert would easily recognise that a rotation of the grid interferometer 100 containing the grid G1 in accordance with the rotation arrow 32 would lead to a change in orientation of the grid lines and thereby change the orientation of the illumination pattern. Further rotation, especially rotation of approx. 180°, serves to change the periodicity of the grid in a given processing region, i.e. changes the periodicity of the illumination pattern. Rather than through considerable rotation, this can also be accomplished by translating the grid interferometer in accordance with the translation arrow 34.

It is often not possible to create the structure in the substrate surface using a single illumination pulse. Rather, multiple illumination pulses will generally be required. In this connection, it is necessary, to prevent distortion of the structures, to ensure that the illumination pattern does not change between the pulses. In any case, this will be the rule; however, exceptions in which an individual processing region is intentionally illuminated with different patterns sequentially are of course not excluded. To keep the illumination pattern stable between the individual pulses, it is necessary that the grid interferometer 100 be fixed in an especially stable way relative to the sample plane P. This is inherently complicated by the fact that the grid interferometer 100 can move.

FIG. 8 shows an advantageous embodiment that solves this problem. A sample carrier 37 is fixed onto a stable foundation 38. The substrate 24 to be processed is arranged on the sample carrier 37. The sample carrier 37 is tightly coupled to a heavy slide pad 40. The expert should dimension the mass of the slide pad 40 and its coupling with the sample carrier 36 such that typical vibrations arising during processing are prevented. Another slide pad 44 with its slide surface 46 is arranged on top of the slide surface 42 of the slide pad 40. The second slide pad 44 is rigidly connected to the grid interferometer 100. It is preferable for the second slide pad 44 to be heavy in order to prevent vibrations. A drive not shown in FIG. 8 is coupled to the second slide pad 44 such that the pad can be made to slide along the slide surface 42.

However, during actual structuring, i.e. at the time at which the substrate surface is illuminated by an illumination pulse, the second slide pad 44 should remain fixed relative to the first slide pad 40. For this purpose, the spindle 48 of an electromagnet is embedded in the first slide pad 40 and a ferromagnetic core 50 is embedded in the slide pad 44. Charging the spindle 48 with power causes the second slide pad 44 to be attracted to the first slide pad 40, which causes reproducible fixing of the slide interferometer 100 relative to the substrate 24 and especially to sample plane P. In this position, any number of pulses can be emitted to structure the currently selected processing region. Next, while in the same position, the grid interferometer can process sequentially additional processing regions for which the same structure pattern is intended. Afterwards, the spindle 48 can be switched off, the grid interferometer 100 can be slid away by means of its drive and once everything has again been fixed in place, additional processing regions can be illuminated with the new illumination pattern by energizing the spindle 48.

Figure 9:
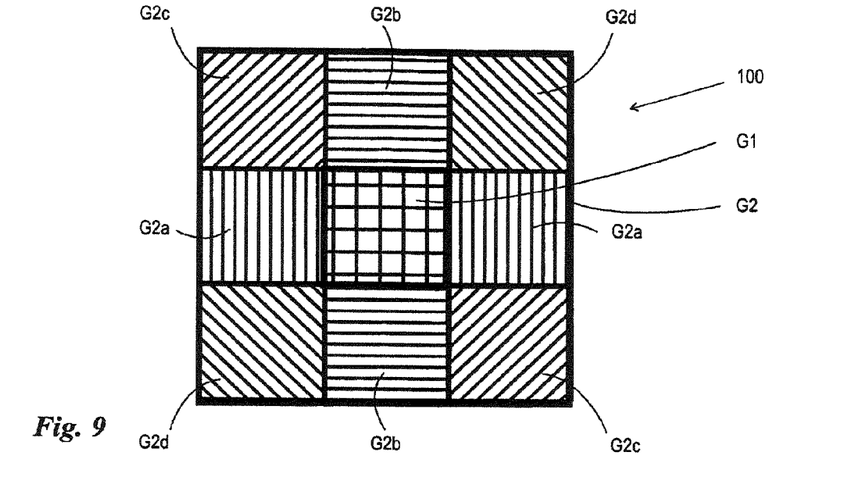
FIG. 9 is a schematic representation of an advantageous grid structure to create the surface structure in FIG. 5.
Figure 10:
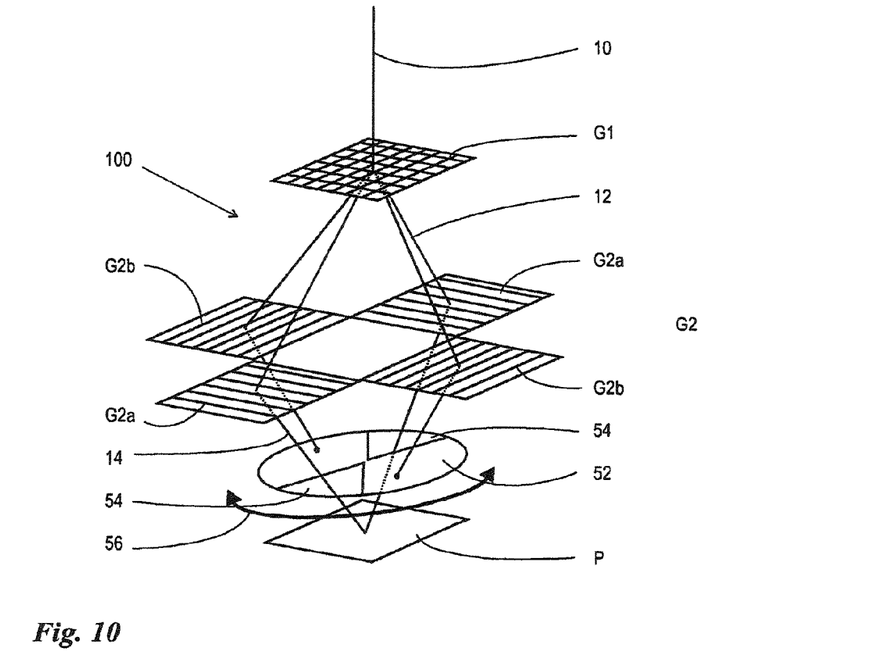
FIG. 10 is a schematic representation of the functional principle of a device using a grid in accordance with FIG. 9.

FIGS. 9 and 10 schematically represent a second version used to create complex patterns. In particular, FIGS. 9 and 10 each show a grid interferometer 100 that can be used instead of the grid interferometer 100 shown in FIG. 2 in the basic form of the device pursuant to the invention shown there. The special grid interferometer 100 described here comprises an input-side grid G1 that has four grid periodicities. In particular, the grid G1 is designed as a perpendicular cross grid that can be conceived as a superimposition of two line grids with the same periodicity oriented perpendicularly to one another. The resulting periodicities are the basic periodicities of the two line grids and the periodicities diagonal to them. The output-side grid G2 comprises eight sub-grids grouped into four grid pairs G2a, G2b, G2c, G2d that are diametrically distanced from one another. The sub-grids of grid G2 are each designed as line grids. Each grid pair G2a, G2b, G2c, G2d comprises two grids with identical grid structure. The periodicities of each grid pair G2a, G2b, G2c, G2d each extend in the direction of one of the periodicities of the input-side grid G1. The grid pairs of the grid G2 are arranged laterally to the grid G1 so that their grid periodicities laterally continue the corresponding periodicity of the grid G1.

The functional principle of such a grid interferometer 100 is depicted in FIG. 10, where for reasons of clarity only the two grid pairs G2a and G2b of the second grid G2 are shown. An input beam 10 falling on the input-side grid G1 is split at every grid periodicity of grid G1 into a diffraction fan of which only the sub-beams 12 of the first order are shown in FIG. 10. When the grid G1 is appropriately designed, the diffraction fans can also actually be reduced to sub-beams of a desired order. Each of the sub-beams 12, depending on its angle of diffraction, falls on a sub-grid of the output-side grid G2, where it is diffracted again. The sub-beams diffracted on the corresponding sub-grids of a grid pair G2a, G2b are superimposed in the sample plane P so as to interfere.

To now select precisely those sub-beams that will result in the desired illumination pattern for the current processing region, a rotatable aperture disk 52 with transparent window regions 54 is additionally arranged behind the output-side grid G2. Depending on the angle setting of the aperture disk 52, certain deviated sub-beam pairs 14 are allowed to pass through and can generate the desired pattern in the sample plane P while other sub-beam pairs 14 are blocked out by the aperture disk 52. The aperture disk 52 moves in synchrony with the movement of the scanner 16. In particular, by configuring the aperture disk 52 in a certain way, the scanner can sequentially process all processing regions requiring the illumination pattern that has passed through. Afterwards, the aperture disk 52 is adjusted such that sub-beams generating another pattern are allowed to pass through. The scanner then processes all processing regions for which this pattern is intended, and so forth. The capacity of the aperture disk 52 to rotate is represented by the rotation arrow 56. Alternatively to the rotatable aperture disk 52, other aperture designs can be used, e.g. freely programmable optical filters.

The advantage of this version compared to the previously described version with a grid interferometer that can be moved using a motor is that the grid interferometer 100, which is sensitive with respect to adjustment, is fixed and in particular, can be rigidly installed in a device. This ensures that the fixed connection to the substrate remains intact at every point of the process. The only element that has to be mechanically movable is the aperture disk 52, which is not a relevant component with respect to the basic function of the grid interferometer 100. However, this advantage is tempered by the disadvantage of less variability in the patterns that can be created.

Figure 11:
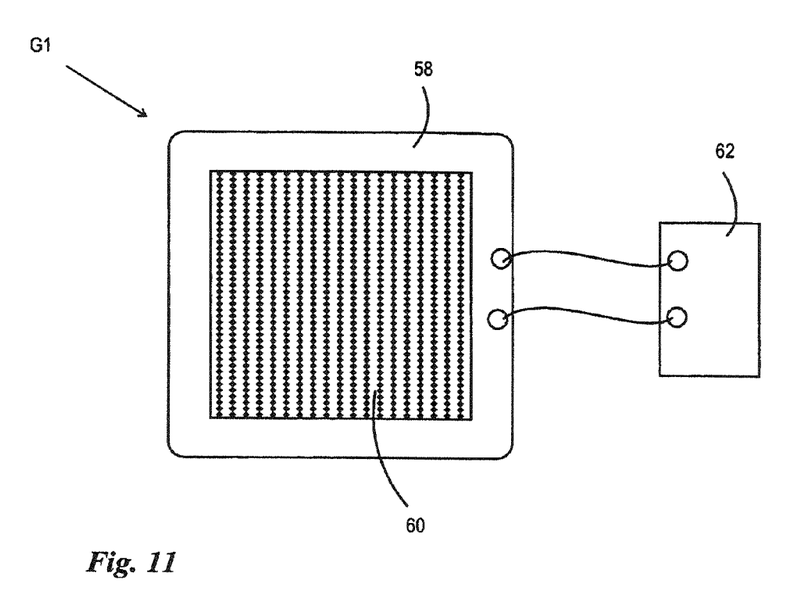
FIG. 11 is a schematic representation of a freely programmable grid.

Finally, FIG. 11 shows a third version used to create different patterns in various processing regions. It shows a freely programmable grid, referred to as the first grid G1, for example, which represents a grid that is part of a grid interferometer that is not shown in more detail. The shown grid G1 shows a window 60 arranged in a frame 58, which window contains a liquid crystal layer between two protective sheets whose pixels can be activated individually by electrodes arranged in the frame 58, which electrodes can be electrically charged by a control unit 62. This means that depending on the combination of the electrically charged electrodes, various corresponding regions of the window will change their transparency and/or refractive index. Such liquid crystal elements are known to the expert. They can be used to create grid structures of virtually any shape. Using multiple such grids arranged behind one another and programmed in coordination, grid interferometers consistent with the present invention can be realised, whose resulting illumination pattern can be changed very quickly. The change must occur synchronously with the deviation of the input beam, i.e. with the control of the scanner 16. It should be noted that the latticing of the grid lines in FIG. 11 serves only to illustrate that the grid's pixels can be individually controlled.

Of course, the embodiments discussed in the specific description and shown in the Figures are merely illustrative exemplary embodiments of the present invention. In light of this disclosure, an expert is given a wide range of possible variations.

The invention claimed is:

1. Method for modifying in a spatially periodic manner at least in some regions a surface of a substrate (24), said surface being disposed on a sample plane (P) by acting upon different regions (211, 221, 231, 232) of the substrate surface successively with a spatially periodic illumination pattern of an energy density above a processing threshold of the substrate surface, where the illumination pattern is generated by diffraction of an input beam (10) and superimposition of resulting, diffracted sub-beams (12, 14) by means of a grid interferometer (100), and where, in order to select the respective substrate surface region to be illuminated (211, 221, 231, 232), the input beam (10) is deviated by means of a beam-deviating unit (16) arranged upstream of the grid interferometer (100), wherein the input beam (10) passes through an F-Theta lens (22) between the beam-deviating unit (16) and the grid interferometer (100).

2. The method according to claim 1, wherein the F-Theta lens (22) is designed as a telecentric F-Theta lens (22).

3. The method according to claim 1, wherein the grid interferometer (100) is moved, especially rotated and/or shifted, perpendicular to its optical axis (20) by a drive in synchrony with the deviation of the input beam (10).

4. The method according to claim 3, wherein the input beam (10) is a pulsed beam whose pulse sequence is synchronised with the deviation of the input beam (10) and the movement of the grid interferometer (100).

5. The method according to claim 3, wherein at least one grid (G1; G2) of the interferometer (100) has a non-rotationally symmetrical grid structure and/or a plurality of adjacent regions (G1a, G1b; G2a, G2b, G2c, G2d) with different grid structures.

6. The method according to claim 1, wherein the grid interferometer (100) comprises
    a first, input-side grid (G1), which exhibits grid periodicities in at least two directions, and
    a second, output-side grid (G2) that exhibits a plurality of pairs of sub-grids (G2a, G2b, G2c, G2d), each pair having a grid periodicity that is identical within each pair and parallel to respectively one grid periodicity of the first grid (G1), where the sub-grids of each pair (G2a, G2b, G2c, G2d) are arranged and spaced diametrically and their respective grid periodicity is oriented parallel to their distance line,
    where a variable aperture arrangement (52, 54) for selecting from among intended, diffracted sub-beams (12, 14) to be superimposed in the sample plane (P) is arranged downstream from the first grid (G1) of the grid interferometer (100) and is varied synchronously with the deviation of the input beam (10).

7. The method according to claim 6, wherein the input beam (10) is a pulsed beam whose pulse sequence is synchronised with the deviation of the input beam (10) and the variation of the aperture arrangement (52, 54).

8. A device for modifying in a spatially periodic manner at least in some regions a surface of a substrate (24) to be arranged in a sample plane (P), comprising
    a beam-deviating unit (16) for selecting a current processing region (211, 221, 231, 232) by controlled deviation of an input beam (10) and
    a grid interferometer (100) arranged downstream from the beam-deviating unit (16) which interferometer diffracts the input beam (10) and superimposes in the sample plane the resulting diffracted sub-beams (12a, b; 14a, b) to create a spatially periodic illumination pattern in the current processing region (211, 221, 231, 232),
    wherein an F-Theta lens (22) arranged between the beam-deviating unit (16) and the grid interferometer (100).

9. A device according to claim 8, wherein the F-Theta lens (22) is designed as a telecentric F-Theta lens (22).

10. A device according to claim 8, wherein
    a drive by means of which the grid interferometer (100) can be moved, especially rotated and/or shifted, perpendicularly to its optical axis (20), and
    a synchronisation unit (36) by means of which the deviation of the input beam (10) and movement of the grid interferometer (100) can be controlled synchronously.

11. The device according to claim 10, wherein the input beam (10) is a pulsed beam whose pulse sequence is synchronised by the synchronization unit (36) with the deviation of the input beam (10) and the movement of the grid interferometer.

12. The device according to claim 10, wherein the at least one grid (G1) of the grid interferometer (100) has a grid structure that is non-rotationally symmetrical and/or a plurality of adjacent regions (G1a, G1b) with different grid structures.

13. The device according to claim 10, wherein the sample plane (P) is provided in the form of a sample carrier (37) that is rigidly fixed to a first slide pad (40) and that the grid interferometer (100) is rigidly fixed to a second slide pad (44), where a slide surface (46) of the second slide pad (44) is arranged on a corresponding slide surface (42) of the first slide pad (42) such that the second slide pad (44) can be slid by means of the drive on the first slide pad (40) and where a pressing force sufficient to prevent relative movement of the slide pads (40, 44) can be applied to the second slide pad (44) relative to the first slide pad (40).

14. The device according to claim 8, wherein the grid interferometer (100) comprises
    a first, input-side grid (G1), which exhibits grid periodicities in at least two directions, and
    a second, output-side grid (G2) that exhibits a plurality of pairs of sub-grids (G2a, G2b, G2c, G2d), each pair having a grid periodicity that is identical within each pair and parallel to respectively one grid periodicity of the first grid (G1), where the sub-grids of each pair (G2a, G2b, G2c, G2d) are arranged and spaced diametrically and their respective grid periodicity is oriented parallel to their distance line
    where a variable aperture arrangement is placed downstream from the first grid of the grid interferometer which arrangement can be used to select diffracted sub-beams intended to be superimposed in the sample plane and where a second synchronization unit (36) is provided by means of which the deviation of the input beam (10) and the variation of the aperture arrangement (52, 54) can be controlled synchronously to select the sub-beams (12, 14).

15. The device according to claim 14, wherein the input beam (10) is a pulsed beam whose pulse sequence is synchronised by means of the synchronization unit (36) with the deviation of the input beam (10) and the variation of the aperture arrangement (52, 54).

* * * * *